METHOD FOR SELECTIVE EPITAXIAL DEPOSITION OF INTERMETALLIC SEMICONDUCTOR COMPOUNDS

Filed July 31, 1970

INVENTORS
KAZUHIRO ITO
SHINYA IIDA
BY Craig, Antonelli, Stewart & Hill
ATTORNEYS United States Patent Office
3,752,714
Patented Aug. 14, 1973

3,752,714
METHOD FOR SELECTIVE EPITAXIAL DEPOSITION OF INTERMETALLIC SEMICONDUCTOR COMPOUNDS

Kazuhiro Ito, Hachioji, and Shinya Iida, Hino, Japan, assignors to Hitachi, Ltd., Tokyo, Japan Filed July 31, 1970, Ser. No. 59,901
Claims priority, application Japan, Aug. 4, 1969, 44/61,008
Int. Cl. H01l 7/36, 7/50
U.S. Cl. 148—175 2 Claims

ABSTRACT OF THE DISCLOSURE

A method of selective epitaxial deposition of intermetallic semiconductor compounds having a zinc blende type crystalline structure, such as gallium arsenide, in rectangular holes etched into {100} oriented substrates of same material as the deposited compound. The holes are oriented in the <100> to <310> directions, so as to obtain hole walls, which are substantially perpendicular with respect to the upper surface of substrate, and which result in the formation of flat upper surfaces of single crystals deposited in those holes. The holes are etched with a $H_2SO_4$:$H_2O_2$ (1:10 by volume) solution.

BACKGROUND OF THE INVENTION

Figure 1:
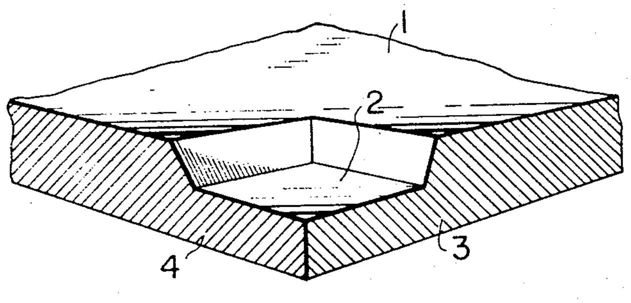
FIG. 1 PRIOR ART

This invention relates to a method for selective epitaxial deposition and more particularly to deposition of intermetallic semiconductor compounds having a zinc blende type crystalline structure.

The importance of selective epitaxial deposition has long been realized in manufacturing of diodes, transistors and many other semiconductor devices, especially in integrated circuit technology.

Generally, the technique involves epitaxial deposition in holes etched into a substrate, which are formed by selective etching of the substrate exposed by holes in a protective film, such as a silicon dioxide film. The technique has been widely utilized for epitaxial deposition of silicon in holes etched into a silicon substrate. Moreover, renewed interest has been shown for use of this technique for gallium arsenide, because the three-dimensional integrated circuit or functional electronic block has become increasingly promising due to the availability of semi-insulating gallium arsenide.

The selective epitaxial deposition of gallium arsenide in substrate holes has been partly studied by Don W. Shaw in the Journal of the Electrochemical Society, vol. 113, No. 9, pages 904 through 908, September 1966, entitled "Selective Epitaxial Deposition of Gallium Arsenide in Holes." He studied especially the selective epitaxial deposition of gallium arsenide in rectangular holes etched with a $H_2SO_4$:$H_2O_2$:$H_2O$ (5:1:1 by volume) solution along the <110> directions into a {100} oriented substrate, by a deposition process utilizing a vapor phase reaction of Ga and GaAs with $AsCl_3$ in an open flow system.

However, research by the applicants has shown that holes etched into a gallium arsenide substrate with a $H_2SO_4$:$H_2O_2$ (1:10 by volume) solution give flatter hole bottoms than a $H_2SO_4$:$H_2O_2$:$H_2O$ (5:1:1 by volume) solution. They have also found that in order to obtain good selective deposition of gallium arsenide in substrate holes it is of primary importance to have perpendicular hole walls with respect to the upper surface of substrate. These features are important because the etching pattern at the bottom of a hole, which is different from the original one formed in a protective film, gives electric characteristics of a p-n junction between a semiconductor crystal deposited in the hole and the substrate, which are different from the expected ones. Additionally, the inclined hole walls forming an obtuse angle with the hole bottom results in the formation of spikes on the edges of the crystal deposited from vapor phase in the hole. These spikes make mask alignment in subsequent process steps difficult. The formation of spikes is probably caused by the almost uniform vapor phase deposition on areas unmasked by holes in the protective film. It has been also observed that the spikes do not disturb subsequent processes if the angle between hole walls and perpendicular planes with respect to the surface of substrate is less than about 15°.

It should be noted that it is much more difficult to etch holes in intermetallic compound semiconductors than in simple substances and obtain perpendicular hole walls in the semiconductor substrate because the different crystallographic principal surfaces of an intermetallic compound semiconductor crystal have greater differences in etching speeds than those of simple substances due to different chemical behaviors of constituent elements of the crystal with respect to an etching solution. Therefore, those surfaces which are more hardly etched by the solution have greater probabilities to appear as outer surfaces in etching for intermetallic semiconductors than for simple semiconductors.

Figure 3:
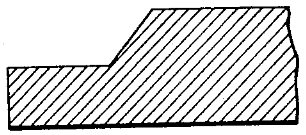
FIG. 3 PRIOR ART
Figure 2:
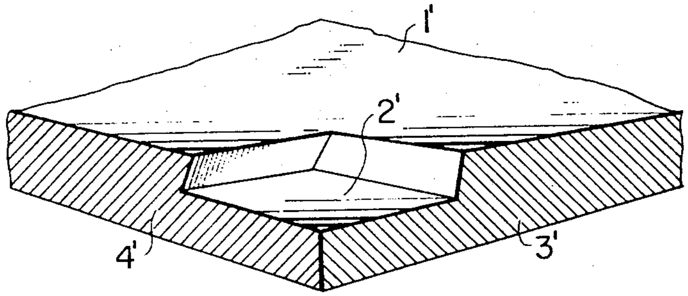
FIG. 2 PRIOR ART
Figure 4:
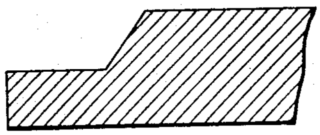
FIG. 4 PRIOR ART
Figure 5:
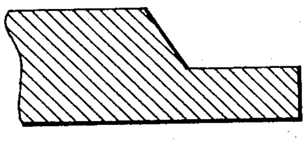
FIG. 5 PRIOR ART
Figure 6:
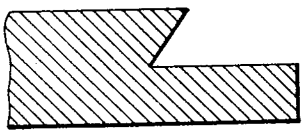
FIG. 6 PRIOR ART

These phenomena will be more clearly understood from the following detailed description of the drawing in which:

FIGS. 1 and 2 are perspective views illustrating a rectangular hole etched along the <110> direction into {100} oriented substrate of silicon and of gallium arsenide, respectively;

FIGS. 3 and 4 represent cross sections of the substrates shown respectively in FIGS. 1 and 2 cut along a {110} plane; and FIGS. 5 and 6 represent cross sections of the substrates shown respectively in FIGS. 1 and 2 cut along another {110} plane.

It should be understood that the drawings are exaggerated in certain dimensions to facilitate the description.

FIG. 1 shows a perspective view illustrating a rectangular hole 2 etched along the <110> directions into a {100} oriented silicon substrate 1 cut along two {110} planes 3 and 4 which are perpendicular to each other. FIGS. 3 and 5 are respectively cross sections of the substrate 1 having the rectangular hole 2 along the {110} planes 3 and 4. FIG. 2 shows a perspective view illustrating a rectangular hole 2' etched with a $H_2SO_4$:$H_2O_2$ (1:10 by volume) solution along the <110> directions into a {100} oriented gallium arsenide substrate 1' cut along two {110} planes 3' and 4' which are perpendicular to each other. FIGS. 4 and 6 are respectively cross sections of the substrate 1' having the rectangular hole 2' along the {110} planes 3' and 4'.

As shown in FIGS. 3 and 5, for silicon substrates, all four hole walls have a tendency to be perpendicular with respect to the upper surface of substrate, although the walls are more or less deviated from well defined perpendicular planes depending upon the etching method utilized. In contrast, when gallium arsenide substrates are etched two of the four hole walls which are on opposite sides of a hole make an obtuse angle, and the other two an acute angle with hole bottom. As mentioned above, these phenomena undesirably influence not only subsequent processes, but also electric characteristics of the semiconductor devices finally obtained.

Accordingly, an object of this invention, therefore, is to provide a method for selective epitaxial deposition of intermetallic semiconductor compounds having a zinc blende type crystalline structure, such as gallium arsenide, in rectangular holes etched into a {100} oriented substrate of the same material as the deposited compound. A further object is to provide a method of obtaining flat upper surfaces of epitaxially deposited material in the holes. More particularly the object of the invention is to provide a method for hole etching giving rectangular holes in which all four walls are substantially perpendicular with respect to an upper surface of the substrate.

This object of the invention is achieved by orienting holes etched with a $H_2SO_4$:$H_2O_2$ (1:10) solution into {100} oriented substrates, in which selective epitaxial deposition is to be formed, in the <100> directions.

The advantage of the alignment according to the invention will be understood as follows. Suppose now a circular hole is etched into a {100} oriented gallium arsenide substrate. The shape of a hole bottom may not be exactly circular, but it is an ellipse, the major and minor axes of which are oriented along two <110> directions, which are perpendicular to each other. These phenomena may be understood as the fact that {111}. A surface is most hardly etched with a $H_2SO_4$:$H_2O_2$ (1:10 by volume) solution and hence etching takes place in such a way that this surface remains as most as possible on hole walls.

It can be also found that the hole walls are almost perpendicular with respect to the upper surface of substrate in the <100> directions which make an angle of 45° with the <110> directions, that is, all hole walls are {100} planes which are perpendicular with respect to the upper {100} surface of substrate, if holes to be etched into a {100} oriented surface of semiconductor crystals having a zinc blende type crystalline structure are rectangles, the sides of which are oriented in the <100> directions.

The advantage of this invention will be clearly shown in the following embodiments.

Example 1

An n type gallium arsenide {100} oriented substrate having an impurity concentration of about $3\times10^{18}$ cm.$^{-3}$ of the Te was lapped and mirror finished.

In order to eliminate distortion of crystal lattice due to lapping, the substrate was etched with a $$H_2SO_4:H_2O_2:H_2O$$

(5:1:1) solution at 40° C. in 5 minutes, washed with water and alcohol, and dried. The substrate was coated with a protective $SiO_2$ film 1000 to 2000 A. thick by pyrolysis of tetraethyl orthosilicate in an evacuated chamber. Rectangular windows were formed in the $SiO_2$ film by photoetching technique, whereby the rectangular windows were oriented in the <100> directions. The hole etching was carried out through the rectangular windows with a $H_2SO_4$:$H_2O_2$ (1:10 by volume) solution at 0° C. in 5 minutes.

The holes thus obtained had hole walls which are perpendicular with respect to the upper surface of substrate.

The deposition process utilized was a vapor phase reaction of GaAs with $AsCl_3$ in an open flow system. The source temperature was maintained at 880° C., while the temperature of the substrate zone was 780° C. Epitaxial growth of GaAs crystal was carried out in 16 minutes by using $H_2$ carrier gas introduced through a $AsCl_3$ bubbler at 0° C. with a flow rate of 150 cc./min. in the system. Single crystals obtained in the holes had flat upper surfaces without spikes.

Example II

Rectangular holes were etched into {100} oriented gallium arsenide substrates in such a way that their longer sides were laid in <910>, <710>, <610>, <510>, <410>, <310>, <320>, and <110> directions. All the other processes were carried out exactly in the same way as described in Example I. The results obtained are summarized in Table 1 together with those obtained for the <100> directions.

TABLE 1

| Direction of sides of rectangular windows | $\theta_1$ | $\theta_2$ | $\alpha$ |
|---|---|---|---|
| <100> | 90° | 90° | 0 |
| <910> | 90°~85° | 90°~95° | 6°20′ |
| <710> | 82°~85° | 92°~98° | 8°10′ |
| <610> | 83°~80° | 95°~100° | 9°30′ |
| <510> | 80°~84° | 97°~103° | 13° |
| <410> | 82°~78° | 95°~105° | 14° |
| <310> | 75°~80° | 100°~105° | 18°26′ |
| <320> | 65°~70° | 110°~115° | 33°41′ |
| <110> | 55°~65° | 120°~130° | 45° |

In the table $\theta_1$ is the angle between the surface of substrate and that of the hole wall which is in the direction indicated in the first column, and $\theta_2$ is the angle between the surface of substrate and that of the hole wall which is in the perpendicular direction to that indicated in the first column. $\alpha$ indicates the angle made by the <100> direction and that indicated in the first column.

As it can be seen from Table 1, for rectangular holes the sides of which make an angle with the <100> directions, which is smaller than that comprised between <100> and <310> directions, deviation of hole walls from the perpendicular planes with respect to the upper surface of substrate is not so significant that no appreciable spikes will be produced by selective epitaxial deposition.

Finally, it will be understood that the process according to this invention can be applied not only to gallium arsenide, but also to all kinds of intermetallic semiconductor compounds having a zinc blende type crystalline structure.

What is claimed is:

1. A method for selective epitaxial deposition of gallium arsenide into rectangular holes etched into {100} oriented substrates of the same material as the epitaxially deposited compound, comprising etching a rectangular hole with a $H_2SO_4$:$H_2O_2$ (1:10 by volume) solution into the surface of said {100} oriented substrate in the <100> to <310> directions, inclusive, then epitaxially depositing a layer of gallium arsenide into said hole.

2. A method for selective epitaxial deposition of gallium arsenide in rectangular holes etched into {100} oriented substrates of the same material as the deposited compound comprising the steps of:

forming a film serving as a mask for selective etching on a {100} surface of said substrate;

forming at least a rectangular hole in said mask by a selective photo-etching technique, which extends to the surface of said substrate, the sides of which are oriented in directions selected from the directions between <100> and <310> inclusive;

etching the area unmasked by said hole into said {100} oriented substrate with a $H_2SO_4$:$H_2O_2$ (1:10 by volume) solution; and depositing epitaxially a semiconductor layer of the same material as said substrate.

References Cited

UNITED STATES PATENTS

| | | | |
|---|---|---|---|
| 3,425,879 | 2/1969 | Shaw et al. | 148—175 |
| 3,556,875 | 1/1971 | Holloway et al. | 148—175 |

OTHER REFERENCES

Compound Semiconductors, vol. 1; Preparation of III–V Compounds, Rheinhold, 1963, p. 453.

Shaw: Selective Epitaxial Deposition of Gallium Arsenide in Holes, J. Electrochemical Soc., September 1966, pp. 904–907.

OSCAR R. VERTIZ, Primary Examiner

J. COOPER, Assistant Examiner

U.S. Cl. X.R.

156—17